US006326127B1

(12) United States Patent
Morren et al.

(10) Patent No.: US 6,326,127 B1
(45) Date of Patent: Dec. 4, 2001

(54) PHOTO-CURABLE POLYMER COMPOSITION AND FLEXOGRAPHIC PRINTING PLATES CONTAINING THE SAME

(75) Inventors: Karin Marie-Louise Renee Morren; Xavier Muyldermans, both of Louvain-la-Neuve (BE)

(73) Assignee: Kraton Polymers U.S. LLC, Houston, TX (US)

( * ) Notice: Subject to any disclaimer, the term of this patent is extended or adjusted under 35 U.S.C. 154(b) by 0 days.

(21) Appl. No.: 09/464,147

(22) Filed: Dec. 16, 1999

(30) Foreign Application Priority Data

Dec. 31, 1998 (EP) .................................................. 98204491

(51) Int. Cl.[7] .......................... G03F 7/038; G03F 7/033; G03F 7/028

(52) U.S. Cl. ..................................... 430/286.1; 430/287.1; 522/110; 522/114; 522/115; 522/116; 522/117; 522/118; 522/119; 522/120; 522/121; 522/122; 522/123; 522/124; 522/125

(58) Field of Search ............................. 430/286.1, 287.1; 522/110, 114, 115, 116, 117, 118, 119, 120, 121, 122, 123, 124, 125

(56) References Cited

U.S. PATENT DOCUMENTS

| | | | |
|---|---|---|---|
| 4,323,637 | * | 4/1982 | Chen et al. ......................... 430/271.1 |
| 5,212,049 | * | 5/1993 | Gersdorf ............................ 430/306 X |
| 5,250,389 | | 10/1993 | Nakamura et al. ................ 430/281.1 |
| 5,496,684 | | 3/1996 | Farber et al. ......................... 430/306 |
| 5,496,685 | | 3/1996 | Farber et al. ......................... 430/306 |
| 6,040,116 | * | 3/2000 | Telser et al. ........................ 430/306 |

FOREIGN PATENT DOCUMENTS

| | | |
|---|---|---|
| 0456336 A2 | 11/1991 | (EP) . |
| 0699961 A1 | 3/1996 | (EP) . |
| 0740214 A2 | 10/1996 | (EP) . |

\* cited by examiner

*Primary Examiner*—Cynthia Hamilton

(57) ABSTRACT

The present invention relates to a photo-curable polymer composition comprising (a) a first block copolymer comprising at least two blocks A of polymerised monovinyl aromatic monomer, at least one internal block B of polymerised conjugated diene monomer, and at least one tapered or random block C of polymerised monovinyl aromatic monomer and polymerised conjugated diene monomer and/or at least one block D which may be a block of polymerised conjugated diene monomer or a tapered or random block of polymerised monovinyl aromatic monomer and polymerised conjugated diene monomer, wherein block C is an internal polymer block adjacent a terminal block A or an internal block A which is adjacent to a terminal block D, and block D is a terminal block adjacent an internal block A, and, optionally, a residue of a coupling agent, wherein the residue, if present, is derived from a coupling agent containing alkoxy or epoxy functional groups; and (b) a photo-initiator. The present invention further relates to a flexographic printing plate precursor comprising a photo-curable layer sandwiched between two release films or a release film and a support. In addition, the present invention relates to a cured polymer composition, obtainable by curing the photo-curable composition; to a flexographic printing plate containing the cured polymer composition, and to a process for printing on a substrate with the flexographic printing plate.

20 Claims, No Drawings

PHOTO-CURABLE POLYMER COMPOSITION AND FLEXOGRAPHIC PRINTING PLATES CONTAINING THE SAME

FIELD OF THE INVENTION

The present invention relates to photo-curable polymer compositions. In particular, it relates to photo-curable polymer compositions for use in printing plates, comprising a block copolymer having two or more polymerised monovinyl aromatic monomer blocks and one or more polymerised conjugated diene blocks, and a photo-initiator. The invention further relates to flexographic printing plate precursors containing the photo-curable polymer composition, as well as to flexographic printing plates.

BACKGROUND OF THE INVENTION

Flexographic printing plates are well known in the art and are especially useful for commercial printing on diverse products such as flexible plastic containers, cartons, plastic bags, boxes and envelopes.

For the purpose of this specification, uncured plates to be used for preparing (cured) flexographic printing plates are referred to as flexographic printing plate precursors.

The flexographic printing plate precursors typically comprise a photo-curable layer prepared from a photo-curable polymer composition, and protective layer(s) to protect the photo-curable layer from daylight. Optionally, the flexographic printing plate precursor further comprises a support. A support is often used to give strength to the flexographic printing plate (precursor).

Alternatively, the side of the flexographic printing plate precursor opposite the image (printing) side of the printing plate is cured to form a support. Typically, in the absence of a support, a flexographic printing plate is prepared by first curing the side of the photo-curable layer of the flexographic printing plate precursor removed from the printing side. As a result that side of the photo-curable layer cross-links, becomes a thermoset substantially insoluble layer and acts as a support for the uncured part of the flexographic printing plate precursor. Subsequently, the side to be used for printing is selectively cured by exposing the photo-curable layer image-wise to light, e.g. UV light. The unexposed (uncured) parts of the layer are then removed in developer baths e.g. with a solvent or water. After drying, the flexographic printing plate is ready for use.

It will be appreciated that the image-wise curing of the flexographic printing plate precursor must be done in a precise manner. Any unintentional curing may lead to an unclear image on the flexographic printing plate, and, hence unclear prints.

In order to avoid undesired scattering of light it is important that the flexographic printing plate precursor is as transparent as possible, that is, not hazy.

Moreover, there is a need for further improvement of the total combination of physical properties of such photo-curable polymer composition for use in a flexographic printing plate (precursor).

Printing plates must be soft and elastic after curing. Normally, elasticity is obtained by the presence of an elastomer in the photo-curable polymer composition. Often, the elastomer is a block copolymer having two or more polymerised styrene blocks and one or more polymerised diene blocks.

The flexographic printing plate precursor must be easy and quick to cure, and the uncured material must be easy to remove. The flexographic printing plate must be dimensionally stable during storage; must be flexible enough to wrap around a printing cylinder; strong enough to withstand the rigors experienced during a printing process; abrasion resistant; soft enough to facilitate ink transfer during the printing process; and resistant enough to the particular ink solvent to avoid blurring of the image.

It will be appreciated that the achievement of an attractive balance of all these physical properties will be difficult. It would be desirable if a photo-curable polymer composition could be found that is less hazy than conventional photo-curable polymer compositions, and, preferably, has an attractive balance of other relevant properties, such as a low Shore A hardness.

SUMMARY OF THE INVENTION

Such a photo-curable polymer composition has now surprisingly been found. Accordingly, the present invention relates to a photo-curable polymer composition comprising (a) a first block copolymer comprising at least two blocks A of polymerised monovinyl aromatic monomer, at least one internal block B of polymerised conjugated diene monomer, and at least one tapered or random block C of polymerised monovinyl aromatic monomer and polymerised conjugated diene monomer and/or at least one block D which may be a block of polymerised conjugated diene monomer or a tapered or random block of polymerised monovinyl aromatic monomer and polymerised conjugated diene monomer, wherein block C is an internal polymer block adjacent a terminal block A or an internal block A which is adjacent to a terminal block D, and block D is a terminal block adjacent an internal block A, and, optionally, a residue of a coupling agent, wherein the residue, if present, is derived from a coupling agent containing alkoxy or epoxy functional groups; and (b) a photo-initiator.

Further aspects of the invention relate to a flexographic printing plate precursor comprising a photo-curable layer sandwiched between two release films or a release film and a support, which photo-curable layer contains the photo-curable polymer composition. In addition, the present invention relates to a cured polymer composition, obtainable by curing the photo-curable polymer composition; to a flexographic printing plate containing the cured polymer composition, and to a process for printing on a substrate with the flexographic printing plate.

DETAILED DESCRIPTION OF THE INVENTION

Typically, and preferably, the photo-curable polymer composition further comprises an ethylenically unsaturated addition-polymerisable cross-linking agent. Such cross-linking agent is typically a component, such as a monomer or a mixture of monomers, that is compatible with the block copolymer(s). Monomers that can be used in the photo-curable polymer composition are well known in the art. Examples of such monomers can be found in U.S. Pat. Nos. 4,323,636; 4,753,865; 4,726,877 and 4,894,315 incorporated herein by reference.

The term "compatible" means that the captioned component can be mixed in a molecular-disperse fashion in the photo-curable composition or that the component has the same breaking index, does not substantially cause haze and does not separate from the photo-curable composition in the course of time, that is does not separate within 14 days, preferably not within one month.

Typically, the ethylenically unsaturated addition-polymerisable cross-linking agent has a boiling point of at least 100° C. at atmospheric pressure and a molecular weight of up to 3000, preferably up to 2000. Examples of suitable ethylenically unsaturated addition-polymerisable cross-linking agents include esters of acrylic acid or methacrylic acid, styrene and derivatives thereof, esters of maleic acid or fumaric acid, acrylamide or methacrylamide and allyl compounds. Preferably, esters of acrylic acid or methacrylic acid are used. Especially preferred monomers are 1,6-hexanediol diacrylate, 1,6-hexanediol dimethacrylate, and hydroxyethyl methacrylate.

The first block copolymer preferably has a total polymerised monovinyl aromatic monomer content in the range from 5 to 25%wt of the block copolymer, more preferably from 10 to 22%wt, most preferably from 15 to 20%wt. The first block copolymer preferably has a total weight average molecular weight as determined by GPC in the range of from 50,000 to 500,000 g/mol, more preferably from 50,000 to 400,000 g/mol. If the first block copolymer is linear, the total weight average molecular weight is more preferably in the range from 50,000 to 300,000 g/mol, even more preferably in the range from 65,000 to 250,000 g/mol.

The weight average molecular weight can be determined with gel permeation chromatography (GPC) using polystyrene calibration standards (according to ASTM D 3536).

The weight average molecular weight of the blocks A of polymerised monovinyl aromatic monomer is typically in the range from 4,000 to 25,000 g/mol, preferably from 5,000 to 20,000 g/mol.

The weight average molecular weight of the blocks B and C typically ranges from 2,000 to 200,000, preferably from 5,000 to 100,000 g/mol. The weight average molecular weight of blocks D typically ranges from 1,000 to 100,000, preferably from 1,000 to 20,000 g/mol.

According to a particularly preferred embodiment the first block copolymer comprises at least one block D, and the weight average molecular weight ratio Mw(block D)/Mw (block B) in the first block copolymer is equal to or less than 0.5, typically from 0.01 to 0.5, preferably from 0.1 to 0.4. If more than one block B or block D is present in the first block copolymer the average of the sum of weight average molecular weight is taken for the B or D blocks respectively.

The first block copolymer preferably has the structure $(D)_x$—A—$(C)_y$—B—$(C)_y$—A—$(D)_x$ or $((D)_x$—A—$(C)_y$—B$)_n$—Z, wherein n is in the range from 2 to 30 and each x and y can be 0 or 1, provided at least one x or y is 1, and Z is the residue of a coupling agent. Preferably, n is in the range from 2 to 6.

The first block copolymer is preferably a linear block copolymer. More preferably, the first block copolymer has the structure A—B—C—A, A—B—A—D, (D—A—B)$_2$—X or (A—C—B)$_2$—X.

According to one embodiment, the photo-curable polymer composition of the invention further comprises a second, typically linear, block copolymer having one block A of polymerised monovinyl aromatic monomer, at least one block B of polymerised conjugated diene monomer, and, optionally, at least one tapered or random block C of polymerised monovinyl aromatic monomer and polymerised conjugated diene monomer and/or at least one block D which may be a block of polymerised conjugated diene monomer or a tapered or random block of polymerised monovinyl aromatic monomer and polymerised conjugated diene monomer, and, optionally, a residue of a coupling agent, wherein the total polymerised monovinyl aromatic monomer content is in the range from 5 to 50 %wt of the block copolymer, and wherein the residue, if present, is derived from a coupling agent containing alkoxy or epoxy functional groups.

The second block copolymer preferably has the structure A—B, A—C—B, D—A—B, or a mixture thereof. The total weight average molecular weight of the second block copolymer, as determined by GPC, is preferably in the range of more than 35,000 to 200,000. More preferably, the weight average molecular weight is in the range from 40,000 to 150,000, even more preferably in the range from 45,000 to 120,000.

The total poly(monovinyl aromatic) content of the second block copolymer is preferably in the range from 5 to 25% by weight, more preferably 10 to 22% by weight, even more preferably 15 to 20% by weight.

The monovinyl aromatic monomer is typically selected from styrene, $C_1$–$C_4$ alkylstyrene and $C_1$–$C_4$ dialkylstyrene, in particular styrene, α-methylstyrene, o-methylstyrene or p-methylstyrene, 1,3-dimethylstyrene, p-tert.-butylstyrene or mixtures thereof, most preferably styrene.

The conjugated diene monomer is typically a conjugated diene monomer containing from 4 to 8 carbon atoms, such as 1,3-butadiene, 2-methyl-1,3-butadiene (isoprene), 2,3-dimethyl-1,3-butadiene, preferably butadiene or isoprene or mixtures thereof, most preferably isoprene.

If 1,3-butadiene is used as the conjugated diene monomer, it may be preferred that a substantial part of the 1,3-butadiene is polymerised by 1,2-addition rather than by 1,4-addition. That is, according to one embodiment the 1,2-vinyl content of the butadiene block is preferably at least 25% by weight, more preferably from 30 to 60% by weight.

The blocks A of polymerised monovinyl aromatic monomer typically contain at least 85%wt of monovinyl aromatic monomer, preferably at least 90%wt, more preferably at least 95%wt. The balance of the polymer block may be derived from another monomer, typically the conjugated diene monomer used in the preparation of the B, C and/or D blocks.

The block(s) B of polymerised conjugated diene monomer typically contain at least 85%wt of conjugated diene monomer, preferably at least 90%wt, more preferably at least 95%wt. The balance of the polymer block may be derived from another monomer, typically the monovinyl aromatic monomer used in the preparation of the A and/or, if present, C blocks.

The tapered block or random block(s) C of polymerised monovinyl aromatic monomer and polymerised conjugated diene monomer typically contains between 15 and 85%wt, preferably from 20 to 80% by weight, more preferably from 30 to 70% by weight of polymerised monovinyl aromatic monomer, the remainder typically being polymerised conjugated diene monomer. Preferably block C is a tapered block. The tapered block preferably has the highest amount of polymerised monovinyl aromatic monomer adjacent a block A of polymerised monovinyl aromatic monomer. Typically, a tapered block C is not located adjacent two A blocks.

The block(s) D may be a block of polymerised conjugated diene monomer or a tapered or random block of polymerised monovinyl aromatic monomer and polymerised conjugated diene monomer. Preferably, block D is a block of polymerised conjugated diene monomer.

If block D is a block of polymerised conjugated diene monomer, then it will typically contain at least 85%wt of conjugated diene monomer, preferably at least 90%wt, more preferably at least 95%wt. The balance of the polymer block may be derived from another monomer, typically the monovinyl aromatic monomer used in the preparation of the A and/or, if present, C blocks.

If block D is a tapered block or random, preferably tapered, block of polymerised monovinyl aromatic monomer and polymerised conjugated diene monomer, then it will typically contain between 15 and 85%wt, preferably from 20 to 80% by weight, more preferably from 30 to 70% by weight of polymerised monovinyl aromatic monomer, the remainder typically being polymerised conjugated diene monomer. If block D is a tapered block, it preferably has the highest amount of polymerised monovinyl aromatic monomer adjacent a block A of polymerised monovinyl aromatic monomer.

Block copolymers are typically prepared by anionic polymerisation. The preparation of block copolymers is well known to those skilled in the art and has been described in e.g. U.S. Pat. Nos. 3,265,765; 3,231,635; 3,149,182; 3,238,173; 3,239,478; 3,431,323; Re. 27,145, incorporated herein by reference, and many handbooks including "Thermoplastic Elastomers, a comprehensive review" (1987), edited by N R Legge, G Holden, H E Schroeder, Hanser publishers.

The block copolymer to be used in the photo-curable composition of the present invention is preferably prepared by full-sequential polymerisation, that is sequential polymerisation of all blocks of the block copolymer with an initiator, typically a monofunctional initiator, such as sec-butyl lithium or tert-butyl lithium. Any second block copolymer is suitably polymerised separately and blended with the first linear block copolymer.

Alternatively, if a coupling agent is used, the polymer arms are polymerised and the arms are coupled with a coupling agent containing alkoxy or epoxy groups, preferably methoxy or ethoxy groups. Examples of such coupling agents include di(m)ethoxyethane, methyltri(m)ethoxysilane, methyldi(m)ethoxysilane, tri(m)ethoxysilane, 1,2-bis(methyl di(m)ethoxysilyl)ethane, tetra(m)ethoxysilane, γ-glycidoxy-propyltri(m)ethoxysilane and diglycidylether of bisphenol A.

The coupling efficiency of such coupling agents is not 100% and the desired coupling efficiency can be tuned to some extent. Accordingly, the product is typically a mixture of coupled first block copolymer and uncoupled second block copolymer.

According to yet another embodiment, the first (linear) and second block copolymers are prepared by the process disclosed in European patent specification No. 691991, which is incorporated herein by reference. The process involves full-sequential polymerisation of the first linear block copolymer and polymerisation of the second block copolymer whilst polymerising the first linear block copolymer by adding a second batch of initiator at a predetermined moment during preparation of the first linear block copolymer.

In the above methods terminating agents are used to terminate any "living" polymer following polymerisation and any coupling with a suitable coupling agent. The terminating agent is a proton-donating compound, preferably an alkanol, more preferably a $C_1$–$C_4$ alkanol, in particular methanol.

Photo-initiators are known to those skilled in the art and examples of suitable photo-initiators have been disclosed in European patent specification No. 0 696 761 and U.S. Pat. Nos. 4,894,315; 4,460,675 and 4,234,676 incorporated herein by reference. Typically, the photo-initiator is selected from optionally substituted polynuclear quinones, aromatic ketones, benzoin and benzoin ethers and 2,4,5-triarylimidazolyl dimers.

Preferred photo-initiators are selected from the group consisting of:

(1) a benzophenone of the general formula (I)

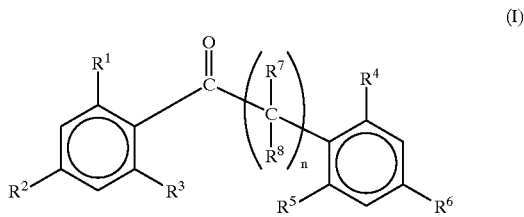

(I)

wherein $R^1$ to $R^6$ independently represent hydrogen or an alkyl group having from 1 to 4 carbon atoms, preferably methyl, and wherein $R^7$ and/or $R^8$ have the same meaning as $R^1$ to $R^6$ or represent an alkoxy group of 1 to 4 carbon atoms and wherein n has a value of 0, 1, or 2, optionally in combination with at least one tertiary amine, (2) a sulphur-containing carbonyl compound, wherein the carbonyl group is directly bound to at least one aromatic ring and is preferably of the general formula

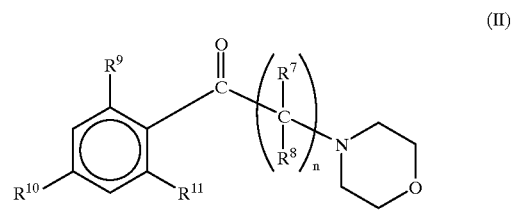

(II)

wherein $R^9$, $R^{10}$, and $R^{11}$ each may represent hydrogen, alkyl of 1 to 4 carbon atoms, or an alkylthio having 1 to 4 carbon atoms, and (3) mixtures of (1) and (2)

Examples of suitable compounds of category (1) are benzophenone, 2,4,6-trimethylbenzophenone, 4-methylbenzophenone and an eutactic mixture of 2,4,6-trimethylbenzophenone and 4-methylbenzo-phenone (ESACURE TZT) and 2,2-dimethoxy-1,2-diphenylethan-1-one (IRGACURE 651) (ESACURE and IRGACURE are trade marks). These compound may be employed in combination with tertiary amines, such as e.g. UVECRYL 7100 (UVECRYL is a trade mark).

Category (2) embraces compounds such as e.g. 2-methyl-1-[4-(methylthio)phenyl]-2-morpholino-propanone-1, commercially available as IRGACURE 907 (IRGACURE is a trade mark).

An example of suitable mixtures (category (3)) is a mixture of 15% by weight of a mixture of 2-isopropylthioxanthone and 4-isopropylthioxanthone, and 85% by weight of a mixture of 2,4,6-trimethylbenzophenone and 4-methyl-benzophenone. This mixture is commercially available under the trade name ESACURE X15.

In a preferred embodiment of the present invention, the photoinitiator is selected from the group consisting of (i) benzophenone, (ii) a mixture of benzophenone and a tertiary amine containing a carbonyl group which is directly bonded to at least one aromatic ring, (iii) 2-methyl-1-[4-(methylthio) phenyl]-2-morpholinopropanone-1 (IRGACURE 907), (iv)

2,2-dimethoxy-1,2-diphenylethan-l-one (IRGACURE 651), of which (iii) and (iv) are most preferred.

Preferably, the photo-curable polymer composition comprises per 100 parts by weight of the first linear block copolymer; 0 to 150 parts by weight of the second block copolymer; 0.1 to 5 parts by weight of photo-initiator; and 0 to 40 parts by weight, more preferably 1 to 40 parts by weight, of the ethylenically unsaturated addition-polymerisable cross-linking agent. The amount of ethylenically unsaturated addition-polymerisable cross-linking agent is most preferably 10 to 35 parts by weight (pbw) per 100 pbw of the first block copolymer. The amount of photo-initiator is more preferably from 0.2 to 3 pbw per 100 pbw of the first block copolymer. The amount of second block copolymer is more preferably from 10 pbw to 75 pbw, even more preferably from 10 to 25 pbw, per 100 pbw of the first block copolymer. Most preferably, however, substantially no second block copolymer, that is less than 5 pbw, preferably less than 2 pbw, is present in the photo-curable polymer composition.

The photocurable composition may further comprise plasticisers, and/or one or more stabilisers such as antioxidants, UV stabilisers and radical scavengers, as well as any other additives known to those skilled in the art to be desirable in photo-curable compositions. Plasticisers are well known to those skilled in the art. Typically, the hardness of a printing plate is decreased by adding a plasticiser to the photo-curable polymer composition. The plasticiser should be substantially compatible with at least the diene blocks of the elastomer.

Examples of plasticisers commonly used include oil and liquid polyolefins such as polyisoprene. Examples of other plasticisers which may be used in the composition of the invention are, oligomers of randomly polymerised styrene and conjugated diene, polybutylene, polybutadiene, polybutene-1, and ethylene-propylene-diene rubber, all having a weight average molecular weight in the range from 300 to 35,000, preferably from 300 to 25,000, more preferably from 500 to 10,000.

The plasticiser, if present, typically comprises up to 40% by weight of the total photo-curable composition, preferably, if present, at least 5% by weight to 35% by weight.

It has been found that low molecular weight diblock copolymers having one polymerised monovinyl aromatic monomer, preferably styrene, block and one polymerised conjugated diene block, preferably a polyisoprene block, are very suitable for use as plasticiser in photo-curable polymer compositions. The weight average molecular weight of these diblock copolymers is typically from 1,000 to 35,000, preferably from 5,000 to 32,000. The poly(monovinyl aromatic) content is typically in the range of from 5 to 25% by weight.

Use of such low molecular weight liquid diblock copolymers in adhesive compositions have been disclosed in WO 94/11437.

Use of such low molecular weight liquid diblock copolymers in photo-curable compositions has been disclosed in EP 0 513 493, in a comparative example, in combination with KRATON® D 1107 triblock copolymer which has been coupled with a halogen-containing coupling agent.

The low molecular weight liquid diblock copolymers can be used in the photo-curable polymer compositions according to the invention without negative effect on the curing of the composition.

Stabilisers such as antioxidants/UV stabilisers/radical scavengers may be present in the photo-curable polymer composition, and are well known to those skilled in the art.

Especially hindered phenols, organo-metallic compounds, aromatic amines, aromatic phosphites and sulphur compounds are useful for this purpose. Preferred stabilisers include phenolic antioxidants, thio compounds and tris (alkyl-phenyl) phosphites.

Examples of commercially available antioxidants/radical scavengers are pentaerythrityl-tetrakis(3,5-di-tert-butyl-4-hydroxy-hydrocinnamate) (IRGANOX 1010); octadecyl ester of 3,5-bis (1,1-dimethylethyl)-4-hydroxy benzene propanoic acid (IRGANOX 1076); 2,4-bis (n-octylthio)-6-(4-hydroxy-3,5-di-tert-butylanilino)-1,3,5-triazine (IRGANOX 565); 2-tert-butyl-6-(3-tert-butyl-2'-hydroxy-5-methylbenzyl)-4-methylphenyl acrylate (SUMILIZER GM); tris (nonylphenyl)phosphite; tris (mixed mono- and diphenyl)-phosphite; bis (2,4-di-tert-butylphenyl)-pentaerythritol diphosphite (ULTRANOX 626); distearyl pentaerythritol diphosphite (WESTON 618); styrenated diphenylamine (NAUGARD 445); N-1,3-dimethylbutyl-N'-phenyl-paraphenylenediamine (SUMILIZER 116 PPD); tris (2,4-di-tert-butylphenyl)phosphite (IRGAFOS 168); 4,4-butylidene-bis-(3-methyl-6-tert-butylphenol) (SUMILIZER BBMS). IRGANOX, SUMILIZER, ULTRANOX, WESTON, and IRGAFOS are trademarks.

The stabiliser(s) is (are) typically present in the photo-curable composition in a total amount from 0.01 to 5% by weight, basis the total photo-curable composition, preferably 0.2 to 3% by weight.

Other well known components that may be present include polymerisation inhibitors, antiozonants, colorants, fillers or reinforcing agents. It belongs to the skill of the skilled person to select the appropriate additional components in the appropriate amounts.

According to a further aspect, the invention relates to a flexographic printing plate precursor comprising a photo-curable layer sandwiched between two release films or a release film and a support, wherein the release film(s) and any support substantially prevent actinic radiation to reach the photo-curable layer, and wherein the photo-curable layer contains the photo-curable polymer composition as described herein.

According to yet another aspect, the invention relates to a cured polymer composition, obtainable by curing a photo-curable composition as described herein with actinic radiation.

Curing is typically carried out by subjecting the photo-curable composition to actinic radiation. Usually, the photo-initiator used is most sensitive in the ultraviolet range. Therefore, preferably, the radiation source should furnish an effective amount of this radiation, more preferably having an output spectrum in the range from 200 to 500 nm, even more preferably in the range from 230 to 450 nm. Particularly suitable UV sources are FUSION bulb lamps having output maxima at 260–270 nm, 320 nm and 360 nm ("HI" bulb), at 350–390 nm ("D" bulb) or at 400–430 nm ("V" bulb) (FUSION is a trade mark). Combinations of these FUSION bulb lamps may also be used. H and D bulb lamps are particularly useful, while a combination of D bulb and H bulb can also be suitably applied.

A further example of a suitable source of UV radiation is a mercury-vapour lamp such as a 300 W/inch (300 W/2.5 cm) UV mercury medium pressure lamp from American UV Company.

The invention further relates to a flexographic printing plate containing the cured polymer composition as described herein.

Uncured portions of the flexographic printing plate are typically removed with a solvent, followed by drying of the plates, according to procedures known to those skilled in the art as e.g. described in EP-A-0 474 178.

Primarily for environmental reasons, uncured portions of the flexographic printing plate may also be removed by water. Water, however, is a bad solvent for the (hydrophobic) block copolymer composition as described herein. Therefore, typically hydrophilic polymers are added to the photo-curable composition, the said polymers having an acid or amine value of 2 to 200, preferably 5 to 120, more preferably 20 to 80, as described in EP-A-0 513 493.

Most flexographic printing plates are uniformly post-exposed to ensure that the photocross-linking process is complete, and optionally subjected to a detackification treatment according to procedures known to those skilled in the art as e.g. described in EP-A-0 474 178.

In addition, the invention relates to a process for printing on a substrate which comprises putting ink on the elevated portion of the image side of the flexographic printing plate as described herein, and bringing the ink-containing flexographic printing plate into contact with the substrate, thereby transferring ink from the flexographic printing plate to the substrate and removal of the flexographic printing plate from the substrate.

The invention will now be described in more detail with reference to the Examples.

Example 1 (Comparative)

A photo-curable polymer composition was prepared by mixing 100 parts of KRATON® D1107 block copolymer with 12 parts by weight of 1,6-hexanediol diacrylate (HDODA), 0.5 parts by weight of antioxidant IRGANOX 1010 (tetrakis-ethylene-(3,5-di-tertiary-butyl-4-hydroxy-hydrocinnamate)methane; IRGANOX is a trademark), and 1.5 parts by weight of photo-initiator IRGACURE 651 (2,2-dimethoxy-1,2-diphenylethan-1-one; IRGACURE is a trademark) in a 25% toluene solution. KRATON® D1107 polymer is a mixture of coupled poly(styrene)-poly(isoprene)-poly-(styrene) triblock copolymer and uncoupled poly(styrene)-poly(isoprene) diblock copolymer. A halide-containing coupling agent was used. The coupling efficiency was 83% by weight. Accordingly, the diblock copolymer content was 17% by weight. The total polystyrene content of the KRATON® D1107 polymer was 15% by weight.

The solution was poured on a plate, and the solvent evaporated at room temperature. Subsequently, the composition was heated to 140° C. and kept at that temperature for 5 minutes, followed by 5 minutes at 140° C., whilst applying 1 MPa pressure in a Schwabenthan press. The photo-curable plate thus obtained was about 2 mm thick. The plate was kept in the dark, since the presence of HDODA makes the plates sensitive to curing in daylight, and since in this case no daylight protective layers had been applied.

The plate was cured with a 300 W/inch (300 W/2.5 cm) UV mercury medium pressure lamp from American UV Company. Samples were passed three and nine times under the lamp at a speed of 10 m/min.

The following test was carried out.

Haze

Haze was measured according to ASTM D1003 on a Colorquest II apparatus on uncured samples without polyethylene support.

Results are given in Table 1.

Example 2

A photo-curable composition was prepared as in Example 1 but block copolymer A was used. Block copolymer A is a poly(styrene)-poly(isoprene)-poly(styrene)-poly(isoprene) tetrablock copolymer. The tetrablock copolymer does not contain a coupling agent. The total polystyrene content is 15% by weight and the total weight average molecular weight of the tetrablock copolymer is 218,700. Block copolymer A is prepared by a full-sequential polymerisation procedure. The weight average molecular weight ratio outer poly(isoprene) block/inner poly(isoprene) block is 0.1.

For this photo-curable composition also the hardness and gel content were determined using the following procedures.

Hardness

Shore A hardness was determined after 24s penetration of the needle in the sample and in accordance with ASTM D 2240.

Gel Content

The gel content is a measure for the degree of cross-linking after curing. To measure the gel content, a known amount of the cured plate is soaked in toluene for one night. The not dissolved mass is dried at 70° C. under vacuum until no further weight loss occurs. The gel content is calculated via: gel content $(\%) = W_{(dried)}/W_{(initial)} * 100$ with $W_{(initial)}$ being the weight of the cured plate prior to dissolving in toluene, and $w_{(dried)}$ being the weight of the cured plate after dissolving in toluene and drying.

Results are given in Table 1.

Example 3 (Comparative)

A photo-curable composition was prepared as in Example 1 but block copolymer composition B was used. Block copolymer composition B is a mixture of 83% by weight of a poly(styrene)-poly(isoprene)-poly(styrene) triblock copolymer and 17% by weight of a poly(styrene)-poly(isoprene) diblock copolymer. The triblock copolymer does not contain a coupling agent. The total polystyrene content is 15% by weight and the total apparent molecular weight of the triblock copolymer is 210,000. The weight average molecular weight of the diblock copolymer is 72,000. Block copolymer composition B is prepared by re-initiation according to the procedure disclosed in European patent specification No. 0691991. Haze, hardness and gel content were measured. Results are given in Table 1.

TABLE 1

|  | Comp. Ex. 1 | Example 2 | Comp. Ex. 3 |
|---|---|---|---|
| Haze (%) | | | |
| No PE support | 72 | 19 | 40 |
| Hardness (Sh A) | | | |
| UV0, 24 s | — | 13 | 31 |
| UV1, 24 s | — | 22 | 36 |
| UV3, 24 s | — | 40 | 40 |
| UV9, 24 s | — | 47 | 49 |
| Gel content (%) | | | |
| UV1 | — | 87 | 63 |
| UV9 | — | 98 | 99 |

UV0 = No UV curing
UV1 = cured by 1 pass under UV lamp
UV3 = cured by 3 passes under UV lamp
UV9 = cured by 9 passes under UV lamp
(Sh A) = Shore A Hardness It can be seen that the photo-curable composition A (Example 2) is significantly less hazy than the photo-curable compositions of Comparative Examples 1 and 3. Also, the gel content after only one pass is significantly higher for composition A, whilst the hardness (Shore A) remains lower.

The composition A was still tacky when tested. If desired, a detackification treatment may be carried out to reduce the tackiness of the cured polymer composition of the present invention.

We claim:

1. A photo-curable polymer composition comprising
   (a) a first block copolymer comprising at least two blocks A of polymerised monovinyl aromatic monomer, at least one internal block B of polymerised conjugated diene monomer, and at least one tapered or random block C of polymerised monovinyl aromatic monomer and polymerised conjugated diene monomer and/or at least one block D which may be a block of polymerised conjugated diene monomer or a tapered or random block of polymerised monovinyl aromatic monomer and polymerised conjugated diene monomer, wherein block C is an internal polymer block adjacent a terminal block A or an internal block A which is adjacent to a terminal block D, and block D is a terminal block adjacent an internal block A, wherein the weight average molecular weight ration Mw(block D/Mw(block B) is equal to or less than 0.5, and, optionally, a residue of an coupling agent, wherein the residue, if present, is derived from a coupling agent containing alkoxy or epoxy functional groups; and
   (b) a phot-initiator.

2. A photo-curable polymer composition as claimed in claim 1 further comprising an ethylenically unsaturated addition-polymerisable cross-linking agent.

3. A photo-curable polymer composition as claimed in claim 1 wherein the first block copolymer has a total polymerised monovinyl aromatic monomer content in the range from 5 to 25%wt of the block copolymer.

4. A photo-curable polymer composition as claimed in claim 1 wherein the first block copolymer is a linear block copolymer.

5. A photo-curable polymer composition as claimed in claim 1 wherein the first block copolymer has the structure (D)x—A—(C)y—B—(C)y—A—(D)x or ((D)x—A—(C)y—B)n—Z, wherein n is in the range from 2 to 30 and each x and y can be 0 or 1, provided at least one x is 1 and Z is the residue of a coupling agent.

6. A phot-curable polymer composition as claimed in claim 5 wherein the first block copolymer has the structure A—B—A—D—or (D—A—B)$_2$—Z.

7. A photo-curable polymer composition as claimed in claim 1 wherein the first block copolymer has a total weight average molecular weight as determined by GPC in the range of from 50,000 to 500,000 g/mol.

8. A photo-curable polymer composition as claimed in claim 1 further comprising a second block copolymer having one block A of polymerised monovinyl aromatic monomer, at least one block B of polymerised conjugated diene monomer, and, optionally, at least one tapered or random block C of polymerised monovinyl aromatic monomer and polymerised conjugated diene monomer and/or at least one block D which may be a block of polymerised conjugated diene monomer or a tapered or random block of polymerised monovinyl aromatic monomer and polymerised conjugated diene monomer, and, optionally, a residue of a coupling agent, wherein the total polymerised monovinyl aromatic monomer content is in the range from 5 to 50 %wt of the block copolymer, and wherein the residue, if present, is derived from a coupling agent containing alkoxy or epoxy functional groups.

9. A photo-curable polymer composition as claimed in claim 8 wherein the second block copolymer has the structure A—B, A—C—B, D—A—B or a mixture thereof.

10. A photo-curable polymer composition as claimed in claim 8 wherein the second block copolymer has a total weight average molecular weight as determined by GPC, in the range of more than 35,000 to 200,000.

11. A photo-curable polymer composition as claimed in claim 8 comprising per 100 parts by weight of the first block copolymer, 0.1 to 5 parts by weight of photo-initiator; 0 to 40 parts by weight of the ethylenically unsaturated addition-polymerisable cross-linking agent; and 0 to 150 parts by weight of the second block copolymer.

12. A photo-curable polymer composition as claimed in claim 11, comprising 20 to 35 parts by weight of the ethylenically unsaturated addition-polymerisable cross-linking agent.

13. A flexographic printing plate precursor comprising a photo-curable layer sandwiched between two release films or a release film and a support, wherein the release film(s) and support substantially prevent actinic radiation to reach the photo-curable layer, and wherein the photo-curable layer contains the photo-curable polymer composition as claimed in claim 1.

14. A photo-curable polymer composition as claimed in claim 1 wherein the monovinyl aromatic monomer is styrene.

15. A photo-curable polymer composition as claimed in claim 14 wherein the conjugated diene monomer is isoprene.

16. A photo-curable polymer composition as claimed in claim 15 wherein the weight average molecular weight ratio Mw(block D)/Mw(block B) is 0.1.

17. A photo-curable polymer composition as claimed in claim 16 wherein the block copolymer has a polystyrene content of 15%.

18. A photo-curable polymer composition comprising
   a block copolymer having the structure A—B—A—D wherein A is a block of a polymerised monovinyl aromatic monomer, B is a block of a polymerised conjugated diene monomer, D is a block of the polymerised conjugated diene monomer, wherein the weight average molecular weight ratio Mw(block D)/Mw(block B) is equal to or less than 0.5; and
   a photo-initiator.

19. A photo-curable polymer composition as claimed in claim 18, wherein the monovinyl aromatic monomer is styrene, the conjugated diene monomer is isoprene, and the weight average molecular weight ratio Mw(block D)/Mw(block B) is 0.1.

20. A photo-curable polymer composition as claimed in claim 19, wherein the block copolymer has a weight average molecular weight of 218,700 and a polystyrene content of 6415%.

* * * * *